United States Patent [19]
Sakamoto et al.

[11] Patent Number: 5,965,930
[45] Date of Patent: Oct. 12, 1999

[54] HIGH FREQUENCY BIPOLAR TRANSISTOR AND METHOD OF FORMING THE SAME

[75] Inventors: Kurt K. Sakamoto, Chandler; Peter J. Zdebel; Michael G. Lincoln, both of Mesa, all of Ariz.

[73] Assignee: Motorola, Inc., Schaumburg, Ill.

[21] Appl. No.: 08/964,001

[22] Filed: Nov. 4, 1997

[51] Int. Cl.$^6$ .................................................. H01L 29/732
[52] U.S. Cl. .......................... 257/584; 257/587; 257/593; 257/526
[58] Field of Search ...................... 257/577, 583, 257/584, 587, 593, 526, 557, 511, 512

[56] References Cited

U.S. PATENT DOCUMENTS

| | | | |
|---|---|---|---|
| 4,014,718 | 3/1977 | Tomozawa et al. | 257/512 |
| 5,049,968 | 9/1991 | Nakagawa et al. | 257/511 |
| 5,218,227 | 6/1993 | Kinoshita et al. | 257/511 |
| 5,548,155 | 8/1996 | Yoshihara | 257/593 |
| 5,565,701 | 10/1996 | Zambrano | 257/500 |

FOREIGN PATENT DOCUMENTS 1230880  5/1971  United Kingdom .

*Primary Examiner*—David B. Hardy
*Attorney, Agent, or Firm*—Rennie W. Dover

[57] ABSTRACT

A high frequency bipolar transistor (30, 60) having reduced capacitance and inductance is formed over a substrate (61). The substrate (61) is heavily doped to form a low resistance current path. A lightly doped epitaxial layer (62) isolates the substrate (61) from layers which form the transistor. The epitaxial layer (62) is the same conductivity type as the substrate (61). A topside substrate contact (73) couples an emitter of the transistor (60) to the substrate (61). The backside of the substrate (61) is metalized and conductively attached to a leaded flag of a leadframe (51) thereby eliminating wirebond inductance in the emitter of the transistor.

24 Claims, 3 Drawing Sheets

HIGH FREQUENCY BIPOLAR TRANSISTOR AND METHOD OF FORMING THE SAME

BACKGROUND OF THE INVENTION

The present invention relates, in general, to transistors and, more particularly, to high frequency bipolar transistors.

Transistors having a bandwidth greater that two gigaHertz (gHz) are commonly used for communication circuits such as cellular phones and pagers. In general, communications circuits include a discrete input stage, often referred to as a "front end", coupled to integrated circuitry. The input stage receives a transmitted radio frequency or microwave frequency signal and reduces the frequency of the received signal to a level that can processed by the integrated circuitry. To improve performance and lower the cost of the communications circuits, semiconductor manufacturers would prefer to build these circuits in a single chip, thereby eliminating the need for discrete devices. However, economical solutions for manufacturing monolithically integrated communications circuits have not been realized because of the cost and complexity of a high performance integrated circuit processes.

FIG. 1 is a top view of a portion of a prior art leadframe 10 having a high frequency bipolar transistor die 12 mounted thereon. High frequency bipolar transistor die 12 has a topside collector contact 13, a topside base contact 14 and a plurality of topside emitter contacts 15. Transistor die 12 is attached to a leaded flag 11 via a thermally conductive die attach material (not shown). Methods for attaching semiconductor die to leaded flags are well known to those skilled in the art.

Collector contact 13 is coupled to leadframe lead 16 via a wirebond 17 and base contact 14 is coupled to leadframe lead 18 via a wirebond 19. Similarly, the plurality of emitter contacts 15 are coupled to leaded flag 11 via wirebonds 20.

FIG. 2 is a simplified model of a prior art high frequency bipolar transistor 21 having a collector electrode 13A, a base electrode 14A, and an emitter electrode 15A. It should be understood that transistor 21 is formed in high frequency bipolar transistor die 12 shown in FIG. 1. Accordingly, collector electrode 13A is coupled to collector contact 13, base electrode 14A is coupled to base contact 14, and emitter electrode 15A is coupled to emitter contact 15. Further, inductor 17A represents the parasitic inductance of wirebond 17, inductor 19A represents the parasitic inductance of wirebond 19, and inductor 20A represents the parasitic inductance of wirebonds 20. The parasitic inductors 17A, 19A, and 20A reduce the performance of transistor 21.

The parasitic wirebond inductances coupled to the collector, base, and emitter of transistor 21 have impedances $Z_c$, $Z_b$, and $Z_e$, respectively, that vary with frequency. A typical value for a wirebond inductance is approximately 0.7 nanoHenries. The inductance of the emitter wirebond affects the voltage gain ($A_v$) of a high frequency bipolar transistor as shown by equation 1:

$$A_v = gm*(1+gm*Z_e)^{-1} \quad (1)$$

where gm is the transconductance of transistor 21.

The noise figure corresponds to the input impedance of transistor 21. In general, the emitter resistance and the emitter inductance dominates the input impedance. In the hybrid-π model, an emitter resistance corresponding to a transistor thermal voltage and a wirebond inductance are reflected back through the base of the bipolar transistor to its input. An approximation of the input resistance ($R_{in}$) is shown in equation 2:

$$R_{in} = \beta*(r_e + 1/Ze) \quad (2)$$

where $r_e$ is the emitter resistance multiplied by the transistor current gain, beta ($\beta$).

The impedance $Z_e$ increases the input resistance, $R_{in}$, with increasing frequency, thereby producing a lower signal-to-noise ratio at higher frequencies.

Accordingly, it would be advantageous to have a transistor capable of operating in the radio and microwave frequency ranges, have an increased gain, and have an improved noise figure. It would be of further advantage to be able to manufacture the transistor using processes capable of manufacturing high performance integrated circuits. In addition, it is desirable to lower the cost of manufacturing the transistor and packaging the transistor.

DETAILED DESCRIPTION OF THE DRAWINGS

Figure 1:
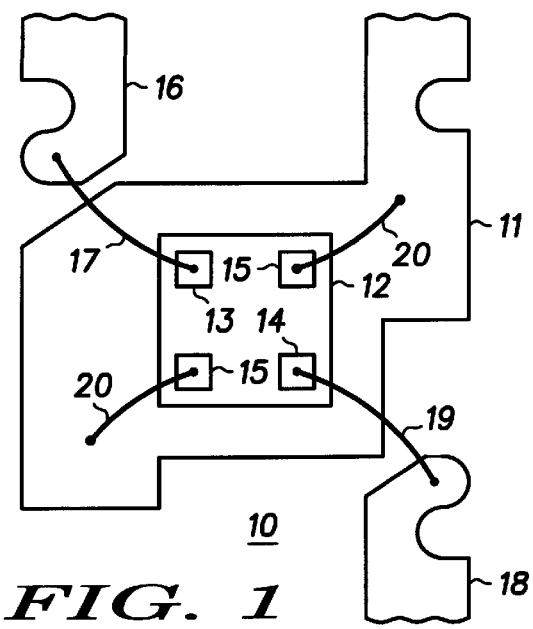
FIG. 1 is a top view of a portion of a prior art leadframe having a high frequency bipolar transistor mounted thereon.
Figure 2:
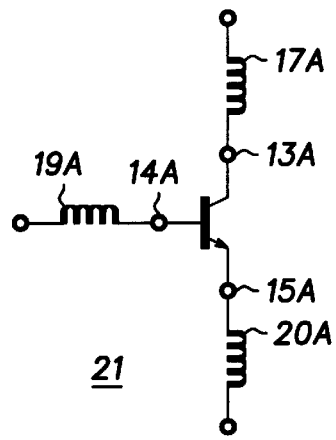
FIG. 2 is a simplified model of a prior art high frequency bipolar transistor having wirebonded collector, base, and emitter contacts.

Cellular telephones and pagers are two types of radio frequency or microwave frequency communication gear that are widely used throughout the world. Because the lower frequency ranges are becoming very crowded, manufacturers of these types of devices have begun designing them to operate at higher frequencies. An important aspect in designing these devices to operate at higher frequencies is to monolithically manufacture the receiving, processing, and transmitting circuitry into a single semiconductor chip. Another important aspect in designing these devices is to lower the parasitic components associated with them. For example, it is highly desirable to lower the inductance of the emitter of the prior art device shown in FIGS. 1 and 2, which in turn increases the transistor gain and the signal-to-noise ratio when the devices are operated at high operating frequencies.

Discrete high frequency transistors are commonly used in the input stage of a communications circuit. It should be noted that a discrete component often contains more than one device. A high frequency transistor operates at frequencies greater than 500 megaHertz (MHz). For many applications, input stage transistors are required to have a bandwidth greater than 2 gHz. As discussed hereinbefore, cost is a significant parameter in whether a device is designed into a product. The frequency response and signalto-noise ratio of the transistor are also parameters that determine whether a component is purchased. The sensitivity of the communications gear to pick up weak signals is associated with the performance of the input stage transistors. Thus, a transistor which has both a reduced cost and increased performance would have a significant advantage over any competitor's parts.

The die size of a transistor directly relates to the cost of the device. Reducing the die size allows more die to fit on a wafer thereby increasing the potential transistor yield per wafer. Process complexity also plays a role in cost. Adding process steps increases wafer costs and reduces yield. A balance between process complexity and die size reduction ultimately leads to a manufacturable part that is very competitive in the marketplace.

Packaging of a transistor is just as critical as the manufacture of the component. The manufacture of the transistor package is a significant percentage of the overall cost of the transistor. A significant cost advantage is obtainable by simplifying the manufacture of the package.

Clearly, the transistor design is integrally linked with the package both in cost and performance. Prior art high frequency transistors have three topside contacts as described with reference to FIGS. 1 and 2. The metal areas which accommodate wirebonds take up a large portion of the die size. The die size is substantially reduced by eliminating a topside contact. For example, a 15–32 percent size reduction is achievable for a single or dual transistor structure. The manufacturing costs are reduced due to the increased number of die that can be fabricated on a semiconductor wafer. The reduction in size also increases performance and reduces packaging costs. A smaller, more inexpensive package is used to house the transistor. The smaller package reduces the length of wire needed to wirebond to the two topside contacts, thereby reducing inductance and increasing performance.

In accordance with an embodiment of the present invention, the emitter contact is moved from the topside of the die to the substrate. Similarly, the collector or the base regions could also be coupled to the topside substrate contact.

The advantage of coupling to the substrate arises because the substrate is diffused region that is heavily doped to minimize resistance. The heavy doping of the substrate is desirable because it is a current carrying region at high frequencies. To lower the parasitic capacitance effects of the heavily doped substrate, a lightly doped epitaxial layer of similar conductivity type to the substrate is formed or disposed on the substrate. The lightly doped epitaxial layer isolates the heavily doped substrate from other layers of the device. Thus, subsequent layers formed over the substrate contact the lightly doped epitaxial layer. Reducing the parasitic capacitance via the lightly doped epitaxial layer allows the transistor to operate at frequencies in the gigaHertz range.

In accordance with one aspect of the present invention, the transistor is formed over the substrate and lightly doped epitaxial layer, wherein the heavily doped substrate and the lightly doped epitaxial layer are not an active portion of the transistor. A topside substrate contact is used as a connection point from one of the collector, base, or emitter regions of the transistor to the substrate. An example of a topside substrate contact is a trench etched from the topside to the substrate and filled with a heavily doped polysilicon. The heavily doped polysilicon serves as the conductive path from the topside to the substrate. A metal line couples the collector, base, or emitter regions of the transistor to the topside substrate contact.

In accordance with another aspect of the present invention, a metal or metal alloy layer is formed on the backside of the wafer. The backside metal produces a low resistance contact between the substrate and a leaded flag area of a leadframe package. The substrate is soldered or conductively attached to the leaded flag area. It should be understood that no wirebonds are used to couple to the leaded flag area. The remaining two topside contacts are wirebonded to leads of the leadframe.

Figure 3:
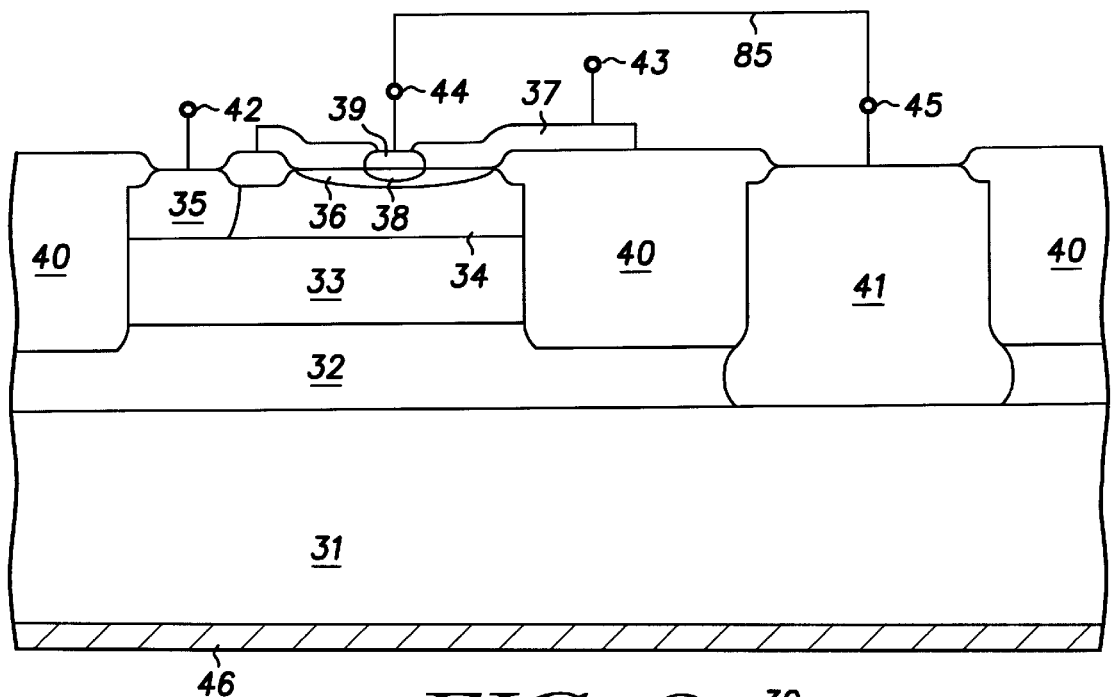
FIG. 3 is a cross-sectional view of a high frequency bipolar transistor in accordance with a first embodiment of the present invention.

FIG. 3 is a cross-sectional view of a high frequency bipolar transistor 30 in accordance with a first embodiment of the present invention. It should be understood that the same reference numerals are used in the figures to denote the same elements. Although transistor 30 is an NPN bipolar transistor, it should be understood this is not a limitation of the present invention. In other words, transistor 30 can be a PNP bipolar transistor. What is shown in FIG. 3 is a substrate 31 of P-conductivity type having a P type epitaxial layer 32 formed or disposed thereon. Substrate 31 serves as a conductive path for the emitter of transistor 30 and therefore is heavily doped to reduce its resistance. A heavily doped substrate has a dopant or doping concentration greater than approximately $10^7$ atoms per cubic centimeter (atoms/cm$^3$). For example, P type substrate has dopant or doping concentration of approximately $5 \times 10^{18}$ atoms/cm$^3$ and a substrate resistance of less than 0.1 ohm. P type epitaxial layer 32 isolates substrate 31 from the transistor structure. Preferably, the dopant or doping concentration of epitaxial layer 32 is at least two orders of magnitude less than that of substrate 31. By way of example, epitaxial layer 32 has a dopant or doping concentration of less than approximately $10^{15}$ atoms/cm$^3$. Epitaxial layer 32 is lightly doped to reduce junction capacitance when an N type layer is formed thereon.

An N+ buried layer 33 is formed on P type epitaxial layer 32 to provide a low resistance path for collector current that will flow in transistor 30. An N type epitaxial layer 34 is formed or disposed on N+ buried layer 33. N type epitaxial layer 34 has a dopant concentration that is less than the dopant concentration of N+ buried layer 33 and serves as the collector region of transistor 31. An N+ region 35 extends from N+ buried layer 33 to the surface of N type epitaxial layer 34. N+ region 35 is a vertical low resistance path which couples a collector contact 42 of the NPN bipolar region to N+ buried layer 33.

A base region 36 is formed in N type epitaxial layer 34. By way of example, base region 36 is coupled to a base contact 43 via, for example, a polysilicon interconnect 37. An emitter region 38 is formed in base region 36. In general, emitter region 38 is formed by implanting a polysilicon region 39 with an N type dopant. A thermal step after implanting polysilicon region 39 diffuses the N type dopant into base region 36 forming emitter region 38. Emitter region 38 is electrically contacted by an emitter contact 44.

Isolation regions 40 reduce sidewall capacitance in bipolar transistor 30. By way of example, isolation regions 40 are made of silicon dioxide. Isolation regions 40 also isolate a P+ sinker region 41 from bipolar transistor 30. P+ sinker region 41 is heavily doped to form a low resistance conductive path from the topside of the die to substrate 31. P+ sinker region 41 is a topside substrate contact for substrate 31. In general, P+ sinker region 41 is doped to a concentration greater than $10^7$ atoms/cm$^3$. For example, a P type substrate doping concentration of approximately $5 \times 10^{18}$ atoms/cm$^3$ produces a resistance for P+ sinker region 41 of less than 0.1 ohm. The spacing of P+ sinker region 41 from the bipolar transistor is such that it will prevent P+ dopant from out-diffusing into epitaxial layer 32 where epitaxial layer 32 and N+ buried layer 33 form a junction. An increase in P type doping in the junction increases the junction capacitance reducing performance of transistor 30. Emitter contact 44 is coupled to a P+ sinker contact 45 via a metal interconnect 46.

Figure 4:
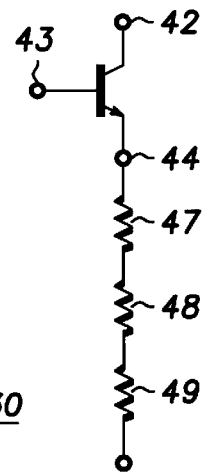
FIG. 4 is a circuit diagram of the high frequency bipolar transistor of FIG. 3.

FIG. 4 is a circuit diagram of high frequency bipolar transistor 30 shown in FIG. 3. It should be understood that the same reference numerals are used in the figures to denote the same elements. What is shown in FIG. 4 is bipolar transistor 30 having collector contact 42, base contact 43, and emitter contact 44. In addition, transistor 30 includes resistors 47, 48, and 49 connected in series with emitter contact 44. Resistor 47 is the resistance of the metal interconnect from emitter contact 44 to P+ sinker contact 45. Resistor 48 is the resistance of P+ sinker 41. Resistor 49 is the resistance of substrate 31. (Sinker 41 and substrate 31 are shown in FIG. 3). The value of each resistor 47, 48, and 49 is less than approximately 0.1 ohm. The conductive path from the emitter of transistor 30 to substrate 31 is purely resistive and will not degrade the performance of transistor 30 as the frequency of its input signal increases.

Figure 5:
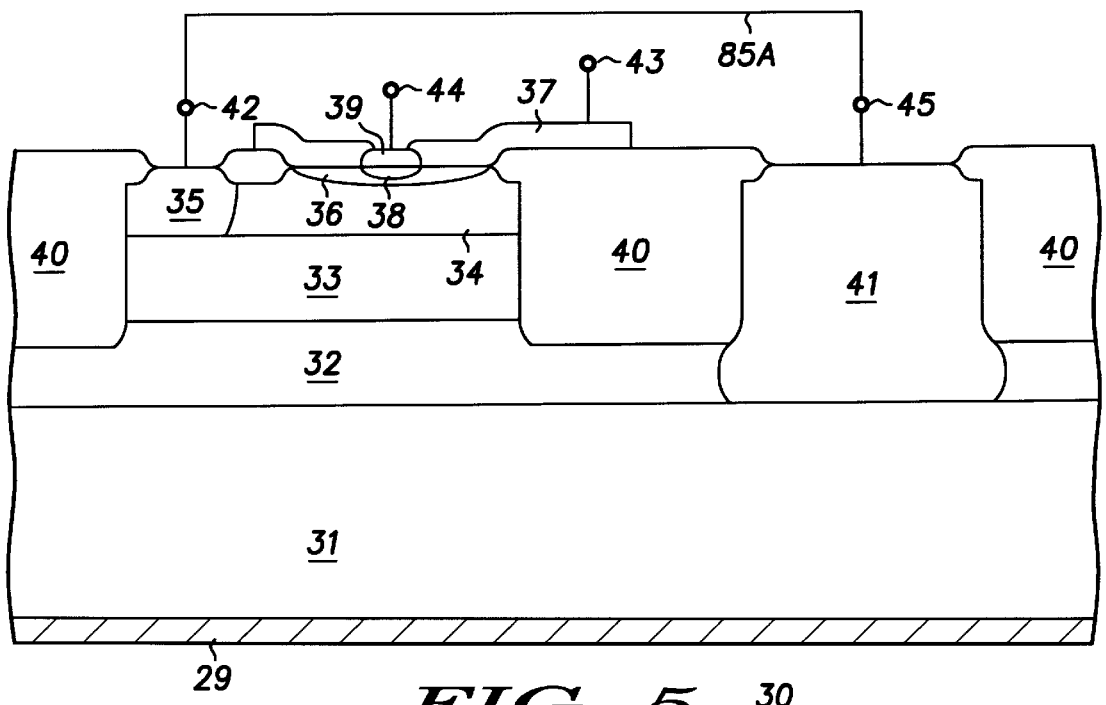
FIG. 5 is a top view of a portion of leadframe having the high frequency bipolar transistor of FIG. 3 mounted thereon.

FIG. 5 is a cross-sectional view of a high frequency bipolar transistor 30A in accordance with a second embodiment of the present invention. It should be understood that the same reference numerals are used in the figures to denote the same elements. In accordance with the second embodiment, collector contact 42 is coupled to P+ sinker contact 45 via a metal interconnect 46A.

Figure 6:
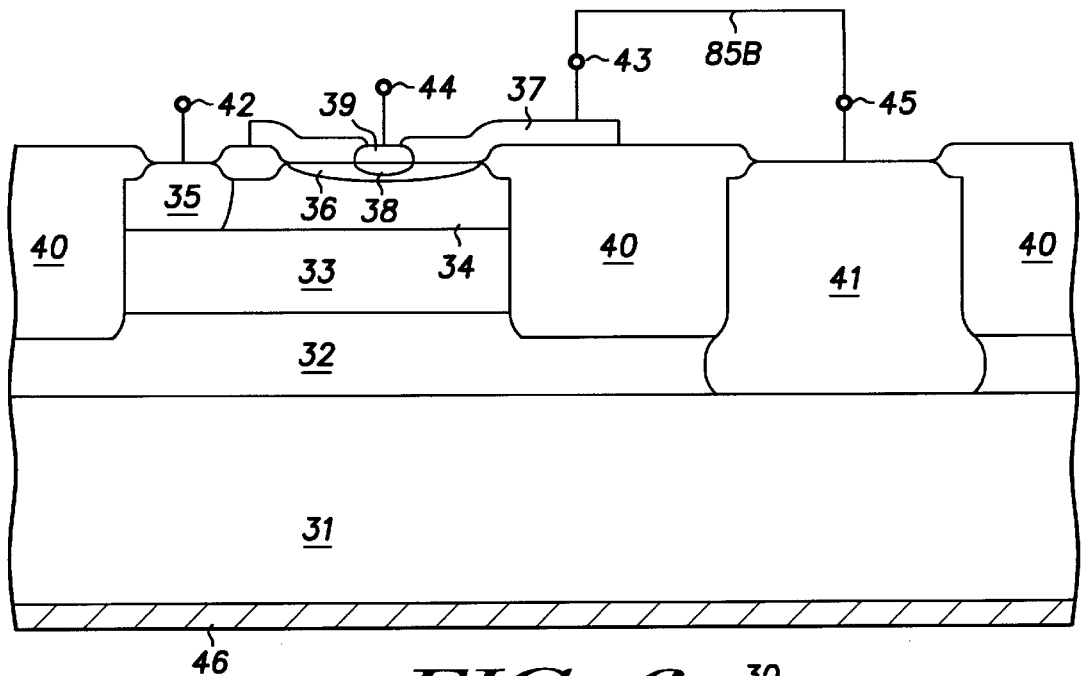
FIG. 6 is a cross-sectional view of a high frequency bipolar transistor in accordance with a second embodiment of the present invention.

FIG. 6 is a cross-sectional view of a high frequency bipolar transistor 30B in accordance with a second embodiment of the present invention. In accordance with the second embodiment, base contact 43 is coupled to P+sinker contact 45 via a metal interconnect 46B.

Figure 7:
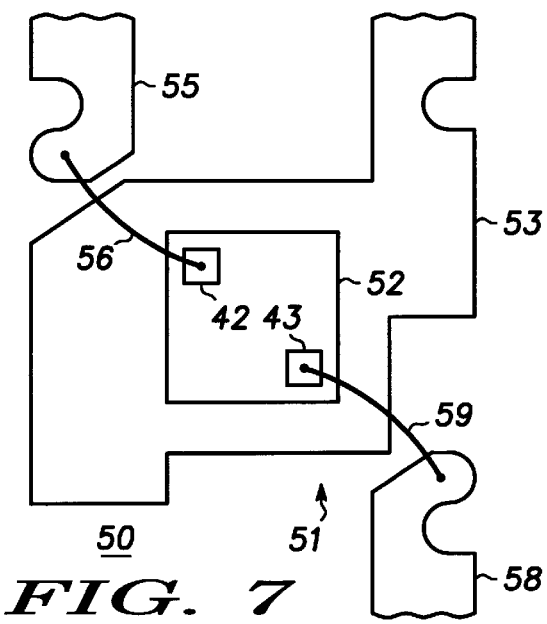
FIG. 7 is a cross-sectional view of a high frequency bipolar transistor in accordance with a third embodiment of the present invention.

FIG. 7 is an illustration of a partial view of a leadframe 51 and a die 52 corresponding to high frequency bipolar transistor 30 shown in FIG. 3. In one embodiment of transistor structure 50, the backside of substrate 31 is metalized with a layer of metal or a metal alloy 29. Metal layer 29 is a low resistance contact to substrate 31. A solder or conductive epoxy (not shown) is used to attach the backside of substrate 31 to leaded flag 53. Substrate 31 couples emitter contact 44 to leaded flag 53. Therefore, wirebonds are not used to couple emitter contact 44 to leaded flag 53, thereby eliminating the wirebond inductance. High frequency bipolar transistor 31 has a topside collector contact 42 and a topside base contact 43. Collector contact 42 is coupled to leadframe lead 55 via a wirebond 56 and base contact 43 is coupled to leadframe lead 58 via a wirebond 59.

Figure 8:
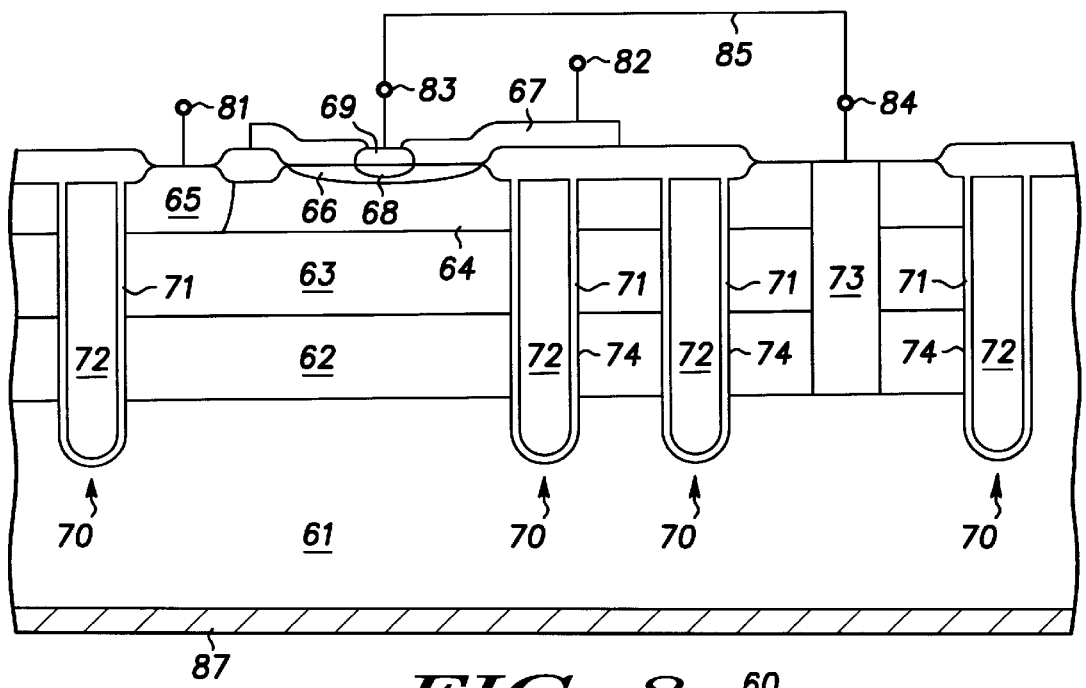
FIG. 8 is a cross-sectional view of a high frequency bipolar transistor in accordance with a fourth embodiment of the present invention.

FIG. 8 is a cross-sectional view of a high frequency transistor 60 in accordance with another embodiment of the present invention. It should be understood that the same reference numerals are used in the figures to denote the same elements. Although bipolar transistor 60 is described as being an NPN bipolar transistor, this is not a limitation of the present invention. Transistor 60 varies for transistor 30 of FIG. 3 in the implementation of the isolation regions and the topside substrate contact. What is shown in FIG. 6 is a substrate 61 of P conductivity type having a P type epitaxial layer 62 formed or disposed thereon. Substrate 61 serves as a conductive path for the emitter of transistor 60 and therefore is heavily doped to reduce its resistance. A heavily doped substrate has a dopant concentration greater than approximately $10^7$ atoms per cubic centimeter (atoms/cm$^3$). For example, P type substrate has dopant concentration of approximately $5 \times 10^{18}$ atoms/cm$^3$ and a substrate resistance of less than 0.1 ohm. P type epitaxial layer 62 isolates substrate 61 from the transistor structure. Preferably, the dopant concentration of epitaxial layer 62 is at least two orders of magnitude less than that of substrate 61. By way of example, epitaxial layer 62 has a dopant concentration of less than approximately $10^{15}$ atoms/cm$^3$. Epitaxial layer 62 is lightly doped to reduce junction capacitance when an N type layer is formed thereon.

An N+ buried layer 63 is formed on P type epitaxial layer 62 to provide a low resistance path for collector current that will flow in transistor 60. An N type epitaxial layer 64 is formed or disposed on N+ buried layer 63. N type epitaxial layer 64 has a dopant concentration that is less than the dopant concentration of N+ buried layer 63 and serves as the collector region of transistor 61. An N+ region 65 extends from N+ buried layer 63 to the surface of N type epitaxial layer 64. N+ region 65 is a vertical low resistance path which couples a collector contact 81 of the NPN bipolar region to N+ buried layer 63.

A base region 66 is formed in N type epitaxial layer 64. In an embodiment of transistor 61, base region 66 is coupled to a base contact 82 via, for example, a polysilicon interconnect 67. An emitter region 68 is formed in base region 66. In general, emitter region 68 is formed by implanting a polysilicon region 69 with an N type dopant. A thermal step after implanting polysilicon region 69 diffuses the N type dopant into base region 66 forming emitter region 68. Emitter region 68 is electrically contacted by an emitter contact 83.

Isolation regions 70 reduce sidewall capacitance in bipolar transistor 60. In the embodiment of bipolar transistor 60, isolation regions 70 are formed by etching a trench 74 from the topside of the die to substrate 61. An oxide layer 71 is grown on the exposed surface of trench 74. Trench 74 is filled with undoped polysilicon 72. Isolation regions 70 also isolate a substrate contact region 73 from transistor 60. Substrate contact region 73 is formed by etching trench 74 from the topside of the die to substrate 61. Substrate contact region 73 is filled with heavily doped polysilicon to form a low resistance conductive path from the topside of the die to substrate 61. In general, substrate contact region 73 is doped to a concentration greater than approximately $10^7$ atoms/cm$^3$. For example, an in-situ doped polysilicon of approximately $10^{20}$ atoms/cm$^3$ is used to fill substrate contact region 73 to produce a resistance of less than 0.1 ohm. A topside substrate contact 84 is formed in contact with substrate contact region 73. Emitter contact 83 and topside substrate contact 84 are coupled together via metal interconnect 85. The use of isolation regions 70 and topside surface contact 84 reduces the die size of bipolar transistor 60. It should be noted that a P+ sinker region (FIG. 3) could be formed in the area where topside substrate contact 84 resides.

A metal or metal alloy layer 87 is formed on the backside of the wafer. Backside metal 87 produces a low resistance contact between substrate 61 and leaded flag area 53 of a leadframe 51 (shown in FIG. 3). Substrate 61 is soldered or conductively attached to the leaded flag area 53. Thus, wirebonds are used to couple substrate 61 to the leaded flag area 53.

By now it should be appreciated that a method and structure for a high frequency transistor have been provided. The bipolar transistor structure reduces capacitance and inductance to increase transistor gain, decrease noise, reduce manufacturing costs and decrease die size. The substrate of the semiconductor die is conductivity attached to a leaded flag of a leadframe to eliminate wirebonds. A topside substrate contact couples an emitter contact of the bipolar transistor to the substrate. Both the substrate and topside substrate contact are heavily doped to have a low resistance value. A lightly doped epitaxial layer isolates the heavily doped substrate from layers which form the transistor. The lightly doped epitaxial layer forms a low capacitance junction which increases the performance of the transistor.

We claim:

1. A high frequency bipolar transistor, comprising:
   a substrate of a first conductivity type;
   a first epitaxial layer of said first conductivity type disposed over said substrate, wherein a doping concentration of said substrate is greater than approximately two orders of magnitude higher than a doping concentration of said first epitaxial layer;
   the bipolar transistor formed over said first epitaxial layer, the bipolar transistor having a collector region, a base region, and an emitter region; and
   a topside substrate contact coupled to one of the collector, base, and emitter regions.

2. The bipolar transistor of claim 1, further including a leadframe having a first lead, a second lead, and a leaded flag, a backside of said substrate being conductively attached to said leaded flag of said leadframe.

3. The bipolar transistor of claim 2, wherein said substrate has a dopant concentration greater than $10^7$ atoms/cubic centimeter (atoms/cm$^3$) and wherein said doping concentration of said first epitaxial layer has a doping concentration less than $10^{15}$ atoms/cm$^3$.

4. The bipolar transistor of claim 3, further including a buried layer of a second conductivity type formed on said first epitaxial layer.

5. The bipolar transistor of claim 4, further including a second epitaxial layer of said second conductivity type formed on said buried layer, said second epitaxial layer forming a collector region of the bipolar transistor.

6. The bipolar transistor of claim 5, further including a base region of said first conductivity type formed in said second epitaxial layer.

7. The bipolar transistor of claim 6, further including an emitter region of said second conductivity type formed in said base region.

8. The bipolar transistor of claim 7, further including an isolation region isolating said topside substrate contact from the collector region of the bipolar transistor.

9. The bipolar transistor of claim 8, wherein said topside substrate contact is a diffused region having a doping concentration greater than $10^7$ atoms/cm$^3$.

10. The bipolar transistor of claim 8, wherein said topside substrate contact is a trench filled with polysilicon having a doping concentration greater than $10^7$ atoms/cm$^3$.

11. A bipolar transistor, comprising:
    a substrate of a first conductivity type;
    a first epitaxial layer of said first conductivity type formed on said substrate, said first epitaxial layer having a doping concentration less than a doping concentration of said substrate;
    a buried layer of a second conductivity type formed on said first epitaxial layer;
    a second epitaxial layer of said second conductivity type formed on said buried layer, said second epitaxial layer forming a collector region of the bipolar transistor;
    a base region of said first conductivity type formed in said second epitaxial layer;
    an emitter region of said second conductivity type formed in said base region; and
    a topside substrate contact of said first conductivity type wherein one of a collector, a base, and an emitter of the bipolar transistor is coupled to said topside substrate contact.

12. The bipolar transistor of claim 11, wherein said substrate has a doping concentration greater than $10^7$ atoms/cm$^3$.

13. The bipolar transistor of claim 11, wherein said first epitaxial layer has a doping concentration less than $10^{15}$ atoms/cm$^3$.

14. The bipolar transistor of claim 13, wherein said buried layer has a doping concentration greater than a doping concentration of said second epitaxial layer.

15. The bipolar transistor of claim 14, further including an isolation region isolating said topside substrate contact from said collector region of the bipolar transistor.

16. The bipolar transistor of claim 15, wherein said topside substrate contact is a diffused region having a doping concentration greater than $10^7$ atoms/cm$^3$.

17. The bipolar transistor of claim 15, wherein said topside substrate contact is a trench filled with polysilicon having a doping concentration greater than $10^7$ atoms/cm$^3$.

18. The bipolar transistor of claim 15, further including a metal or metal alloy layer formed on a backside of said substrate.

19. The bipolar transistor of claim 18, further including a leadframe comprising:
    a first lead coupled to said collector region of the bipolar transistor;
    a second lead coupled to said base region of the bipolar transistor; and
    a leaded flag wherein said metal or metal alloy layer formed on said backside of said substrate is conductively attached to said leaded flag.

20. The bipolar transistor of claim 19, wherein said metal or metal alloy layer formed on said backside of said substrate is conductively attached to said leaded flag with solder.

21. The bipolar transistor of claim 20, wherein said metal or metal alloy layer formed on said backside of said substrate is conductively attached to said leaded flag with a conductive epoxy.

22. A method of extending a frequency response of a bipolar transistor, the method comprising the steps of:
    providing a heavily doped substrate;
    isolating said heavily doped substrate from subsequently formed layers with a lightly doped epitaxial layer formed thereon, said lightly doped epitaxial layer being of similar conductivity type;
    forming the bipolar transistor over said heavily doped substrate;
    forming a topside substrate contact;
    coupling one of a collector region, a base region, and an emitter region to the topside substrate contact; and
    conductively attaching a backside of said heavily doped substrate to a leaded flag of a leadframe.

23. The method of claim 22, wherein the step of forming a topside substrate contact includes the steps of:
    etching a trench in said heavily doped substrate; and
    filling said trench with heavily doped polysilicon.

24. The method of claim 22, further including a step of forming a metal or metal alloy layer on a backside of said heavily doped substrate.

* * * * *